United States Patent
Winkelmann et al.

(10) Patent No.: US 12,422,463 B2
(45) Date of Patent: Sep. 23, 2025

(54) SYSTEM FOR A CABLE SECTION, TRANSMISSION SYSTEM FOR TRANSMITTING ELECTRIC ENERGY, AND METHOD FOR OPERATING THE SYSTEM

(71) Applicant: Maschinenfabrik Reinhausen GmbH, Regensburg (DE)

(72) Inventors: Erik Winkelmann, Dresden (DE); Thomas Steiner, Radebeul (DE); Peter Birkholz, Dresden (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 325 days.

(21) Appl. No.: 17/913,170

(22) PCT Filed: Feb. 24, 2021

(86) PCT No.: PCT/EP2021/054566
§ 371 (c)(1),
(2) Date: Sep. 21, 2022

(87) PCT Pub. No.: WO2021/190849
PCT Pub. Date: Sep. 30, 2021

(65) Prior Publication Data
US 2023/0160943 A1    May 25, 2023

(30) Foreign Application Priority Data
Mar. 26, 2020 (DE) .................. 10 2020 108 382.3

(51) Int. Cl.
*G01R 31/14* (2006.01)
*G01R 31/08* (2020.01)
(52) U.S. Cl.
CPC .......... *G01R 31/14* (2013.01); *G01R 31/083* (2013.01)

(58) Field of Classification Search
CPC .... G01R 31/14; G01R 31/083; G01R 31/088; G01R 23/005; G01R 29/02; G01R 31/1272; G08B 21/182
See application file for complete search history.

(56) References Cited

U.S. PATENT DOCUMENTS 5,272,439 A     12/1993  Mashikian et al.
6,418,385 B1 *   7/2002  Hucker ............... G01R 31/088
                                                                  702/182
(Continued)

FOREIGN PATENT DOCUMENTS

DE         60020050 T2       1/2006
DE         69333936 T2       6/2006
(Continued)

OTHER PUBLICATIONS

J. P. Steiner, P. H. Reynolds and W. L. Weeks, "Estimating the location of partial discharges in cables," in IEEE Transactions on Electrical Insulation, vol. 27, No. 1, pp. 44-59, Feb. 1992 (Year: 1992).*

*Primary Examiner* — Daniel R Miller
(74) *Attorney, Agent, or Firm* — LEYDIG, VOIT & MAYER, LTD.

(57) ABSTRACT

A system includes: a sensor configured to detect electrical signals of a cable section for transmitting electrical energy; a processor; a data memory; and a signal interface. The data memory stores a set of curves with an associated distance to the sensor and representing a pulse response of an electrical pulse predetermined by a cable model as a result of a modeled partial discharge at the associate distance. The sensor detects a discharge signal caused by an actual partial discharge on the cable section, and transmits a measurement signal to the processor. Based on the first measurement signal, the processor determines which among the curves in the set correlates best with the first discharge signal, as the (Continued)

first discharge curve. The processor determines a sensor distance between the actual partial discharge and the sensor based on the distance associated with the discharge curve. The signal interface transmits the sensor distance.

21 Claims, 7 Drawing Sheets

(56) References Cited

U.S. PATENT DOCUMENTS

| | | | |
|---|---|---|---|
| 6,448,782 B1 | 9/2002 | Pakonen et al. | |
| 7,676,333 B2 * | 3/2010 | Younsi | G01R 31/1227 |
| | | | 324/458 |
| 2016/0282402 A1 * | 9/2016 | Markalous | G01R 31/1272 |
| 2021/0356507 A1 | 11/2021 | Winkelmann et al. | |

FOREIGN PATENT DOCUMENTS

| | | |
|---|---|---|
| DE | 102018126743 B3 | 1/2020 |
| JP | H0666875 A * | 3/1994 |
| KR | 20140067653 A | 6/2014 |

\* cited by examiner

SYSTEM FOR A CABLE SECTION, TRANSMISSION SYSTEM FOR TRANSMITTING ELECTRIC ENERGY, AND METHOD FOR OPERATING THE SYSTEM

CROSS REFERENCE TO RELATED APPLICATIONS

This application is a U.S. National Phase application under 35 U.S.C. § 371 of International Application No. PCT/EP2021/054566, filed on Feb. 24, 2021, and claims benefit to German Patent Application No. DE 10 2020 108 382.3, filed on Mar. 26, 2020. The International Application was published in German on Sep. 30, 2021 as WO 2021/190849 A1 under PCT Article 21(2).

FIELD

The present disclosure relates to a system for an electrical cable section for transmitting electrical energy, to a transmission system for transmitting electrical energy, and to a method for operating the system for an electrical cable section for transmitting electrical energy.

BACKGROUND

Electrical cable sections transmit electrical energy. A cable section can consist of a single cable portion or of a plurality of cable portions coupled in series. The cable section can also be referred to as an electrical cable. Electrical energy can be transmitted over an electrical cable section using direct-current (DC) voltage or alternating-current (AC) voltage. Very high voltages are often used to transmit electrical energy over long distances. In this case, the cable section may be in the form of a high-voltage cable. The cable section often comprises an electrically conductive core which can be formed from a multiplicity of individual electrically conductive wires. A plurality of layers of different material and/or with different functions are often arranged around the core. One of the layers can be an insulating layer.

In practice it can happen that a so-called partial discharge takes place. This partial discharge causes a sudden electrical signal, which propagates from the location of the partial discharge, which is also referred to as the partial discharge location, in opposite directions of the cable section. The signal caused by the partial discharge is also referred to as a partial discharge signal. The partial discharge signal can be detected with a sensor at the end of the cable section. However, it must be taken into account that the partial discharge signal is subject to attenuation and dispersion on the route between the partial discharge location and the sensor due to the physical properties of the cable section. The attenuation and the dispersion depend, for example, on the frequency components of the pulse caused by the partial discharge, on the structural design of the cable section, on the way in which the cable section is laid, on the temperature of the cable section and/or on the age of the cable section. In addition, a single sensor at one end of the cable section is not sufficient. Rather, a second sensor is required at the opposite end of the cable section in order to be able to use the propagation times and triangulation to calculate where the partial discharge took place or where the partial discharge is located.

Due to the dependence of the attenuation and the dispersion of the partial discharge signal, there are often significant deviations between the calculated partial discharge location and the actual partial discharge location. Due to the attenuation and dispersion mentioned above, it can also happen that partial discharge signals are subject to such strong dispersion and/or attenuation, in particular frequency-dependent attenuation, that they are not recognized as pulse signals by the sensors and/or an evaluation device. There is therefore the risk of partial discharges occurring in cable sections and not being detected. If a plurality of such partial discharges occur at the same partial discharge location, this can lead to significant damage to the cable section, which must be avoided.

SUMMARY

In an embodiment, the present disclosure provides a system that is for an electrical cable section transmitting electrical energy. The system includes: a first sensor configured to detect electrical signals of the cable section; a processor; a data memory; and a signal interface. The data memory has stored therein a first set of curves having a plurality of first curves, each with an associated distance to the first sensor, wherein each first curve represents a pulse response of an electrical pulse, which is predetermined by a cable model of the cable section, as a result of a modeled partial discharge at the distance to the first sensor associated with the respective first curve on the cable section. The first sensor is configured to detect an electrical signal, which is referred to as a first discharge signal and is caused by an actual partial discharge on the cable section, and to directly or indirectly transmit a first measurement signal M representing the first discharge signal to the processor. The processor is configured, based on the first measurement signal M, to determine one of the first curves in the first set of curves, which, among the first curves in the first set of curves, correlates best with the first discharge signal, as the first discharge curve. The processor is configured to determine a first sensor distance E between the actual partial discharge and the first sensor based on the distance associated with the first discharge curve. The signal interface is designed to transmit an output signal U which represents the first sensor distance E.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
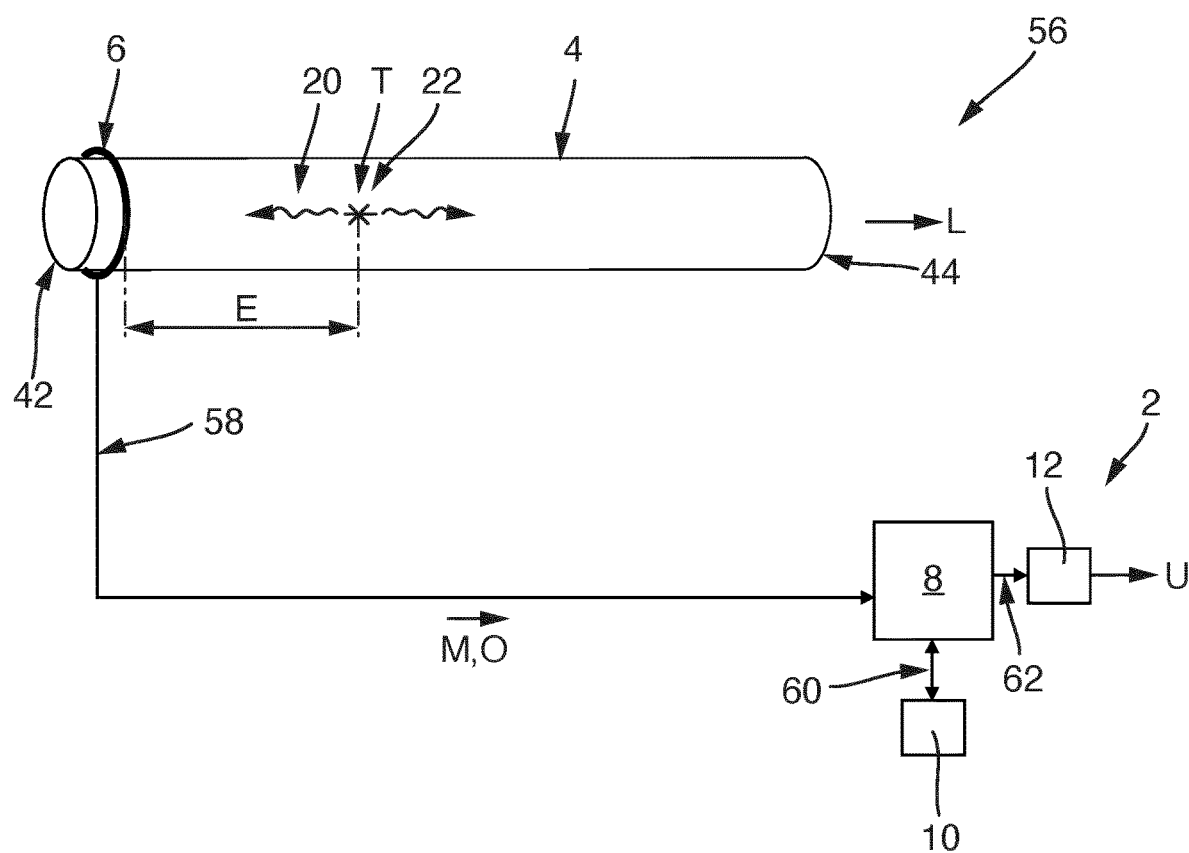
FIG. 1 shows a schematic illustration of a first advantageous configuration of the system.

Aspects of the present disclosure provide a system and an associated method that allow a partial discharge to be reliably detected and a distance between the partial discharge location and the sensor to be precisely determined.

According to a first aspect of the disclosure, a system for an electrical cable section for transmitting electrical energy is provided. The system has a first sensor for detecting electrical signals of the cable section, a processor unit, a data memory, and a signal interface. The data memory has, stored therein, a first set of curves comprising a plurality of first curves, each with an associated distance to the first sensor, wherein each first curve represents a pulse response of an electrical pulse, which is predetermined by means of a cable model of the cable section, as a result of a modeled partial discharge at the distance to the first sensor associated with the respective first curve on the cable section. The first sensor is designed to detect an electrical signal which is referred to as the first discharge signal and is caused by an actual partial discharge on the cable section. In addition, the first sensor is designed to directly or indirectly transmit a first measurement signal to the processor unit, wherein the first measurement signal represents the first discharge signal. The processor unit is configured, based on the first measurement signal, to determine one of the first curves in the first set of curves, which, among the first curves in the first set of curves, correlates best with the first discharge signal, as the first discharge curve. Which of the first curves in the first set of curves best matches or correlates with the first discharge signal can be determined by using similarity measures in the feature space, such as Euclidean distance, Mahalanobis distance and/or cosine similarity. The processor unit is configured to determine a first sensor distance between the actual partial discharge and the first sensor based on the distance associated with the first discharge curve. The signal interface is designed to transmit an output signal which represents the first sensor distance.

Studies have shown that the partial discharge on an electrical cable section can be modeled by means of an electrical pulse. In addition, it was found that the cable section can be modeled by means of a mathematical model, specifically the cable model which can be set by means of a multiplicity of parameters. These parameters can be set such that the model models an actual cable section. If this cable model is now used to cause a partial discharge through a modeled pulse at a partial discharge location of the modeled cable section, the pulse response at one end of the cable section or at another sensor location on the cable section can be determined with the same cable model. The pulse response or at least part of the pulse response then forms a curve. The pulse response or curve changes when the distance between the modeled location for the sensor and the modeled location for injecting the electrical pulse is changed. It is therefore possible to use the cable model to determine associated curves for a multiplicity of different distances in each case. These curves can form the plurality of first curves, each with an associated distance to the first sensor, which are stored in the data memory. The first curves differ in this case both in terms of their frequency spectrum and in terms of the amplitude spectrum. For example, it was found that the larger the modeled distance between the partial discharge location and the sensor, the lower the frequency spectrum of the curve is, and the size of the maximum amplitude is also smaller.

With regard to the system, provision is therefore preferably made for the data memory to have stored a first set of curves comprising at least 10 first curves, at least 20 first curves or at least 30 first curves. The distances to the sensor which are associated with the first curves can form a series of longer distances in each case, with the distances being designed to be equidistant from one another.

When an electrical signal of the cable section is detected by the first sensor, this can be compared with the first curves in order to determine which of the curves best matches the detected signal. This curve is assigned a distance stored in the data memory. This distance then corresponds to the actual distance between the first sensor and the actual partial discharge on the electrical cable section.

Provision is therefore made for the first sensor to be designed to detect an electrical signal which is referred to as the first discharge signal and is caused by an actual partial discharge on the cable section. The first sensor can also transmit a first measurement signal to the processor unit, the first measurement signal representing the detected, first discharge signal. The first discharge signal is usually an analog signal. In contrast, the first measurement signal is preferably a digital signal. This offers the advantage that there is no deterioration in information relating to the detected, first discharge signal during transmission to the processor unit. The first sensor can therefore be designed to digitize the detected, first discharge signal and form the first measurement signal from it.

By transmitting the first measurement signal to the processor unit, the processor unit not only receives the information relating to the first measurement signal as such, but also information relating to the first discharge signal which is represented by the first measurement signal. The processor unit can thus select, from among the plurality of first curves in the first set of curves, the curve which best reproduces the detected, first discharge signal. Therefore, the processor unit is configured, based on the first measurement signal, to determine one of the first curves of the plurality of first curves, which, among the first curves in the first set of curves, correlates best with the first discharge signal, as the first discharge curve. For example, the processor unit may be configured to perform an auto-correlation for each of the first curves with the first discharge curve, such that performing each of the auto-correlation functions results in an auto-correlation value. The first curve for which the greatest auto-correlation value was determined is then the curve among the first curves in the first set of curves that correlates best with the first discharge signal. In principle, however, there are also other methods for determining the curve among the first curves in the first set of curves that correlates best with the first discharge signal. The corresponding curve is referred to as the first discharge curve.

The processor unit is preferably coupled to the data memory, with the result that the processor unit can access the data memory. In particular, the processor unit can be configured to read out the data relating to the first curves and the associated distances from the data memory. It was previously explained that the processor unit is configured to determine the first discharge curve. This first discharge curve is one of the plurality of first curves stored in the data memory. A distance representing the distance between the partial discharge and the sensor is stored in the data memory for each first curve. The processor unit is therefore preferably configured to read out the distance associated with the first discharge curve from the data memory. Provision is therefore made for the processor unit to be configured to determine a first sensor distance between the actual partial discharge and the first sensor based on the distance associated with the first discharge curve. The first sensor distance is preferably the distance associated with the first discharge curve.

The first set of curves was previously determined using a cable model which can be adapted to the actual cable section in a particularly precise manner. Thus, the cable model can also take into account the actual attenuation and/or dispersion for pulses that are caused by partial discharges. The first curves in the first set of curves preferably differ both in terms of their frequency response and in terms of their amplitude response. This allows particularly precise tuning of the first curve among the first curves in the first set of curves that best matches the first discharge signal. It is therefore preferably the amplitude response and the frequency response that influence which of the first curves is determined as the first discharge curve here. In practice, it has been found that the first discharge curve among the plurality of the first discharge curves can be determined so precisely that the first sensor distance associated with the first discharge curve indicates the actual distance between the sensor and the partial discharge location at which the partial discharge took place with particular precision.

The system also has a signal interface designed to transmit an output signal that represents the first sensor distance. In particular, the output signal can be sent from the signal interface. As a result, the first sensor distance is available to further components, devices and/or systems. In particular, the system can have further modules and/or units that are designed to further process the first sensor distance. It is therefore also possible for the signal interface to form an integral part of the processor unit. The processor unit and the signal interface can therefore be designed integrally.

The first sensor of the system can be designed to repeatedly and/or periodically detect an electrical signal. This results in a first discharge curve and a first sensor distance also being determined each time an electrical signal is detected. The processor unit can be designed accordingly. In addition, the signal interface can be designed to transmit the output signal in such a way that the most recent sensor distance is transmitted in each case. The output signal can therefore periodically transmit the previously determined, first sensor distances. The periodic detection of electrical signals using the first sensor offers the advantage that the electrical cable section can be continuously monitored by means of the system.

One advantageous configuration of the system is distinguished by the fact that the system has a second sensor for detecting electrical signals of the cable section. The data memory has preferably stored a second set of curves comprising a plurality of second curves, each with an associated distance to the second sensor, wherein each second curve represents a pulse response of an electrical pulse, which is predetermined by means of the cable model of the cable section, as a result of a modeled partial discharge at the distance to the second sensor associated with the respective second curve on the cable section. In addition, the first sensor and the second sensor can be fastened to the cable section at a predetermined sensor distance from one another. The second sensor is preferably designed to detect an electrical signal which is referred to as the second discharge signal and is caused by the same actual partial discharge on the cable section. Furthermore, the second sensor is preferably designed to directly or indirectly transmit a second measurement signal representing the second discharge signal to the processor unit. The processor unit is preferably configured, based on the second measurement signal, to determine one of the second curves in the second set of curves, which, among the second curves, correlates best with the second discharge signal, as the second discharge curve. Which of the second curves in the second set of curves best matches or correlates with the second discharge signal can be determined by using similarity measures in the feature space, such as Euclidean distance, Mahalanobis distance and/or cosine similarity. Furthermore, the processor unit is preferably configured to determine the first sensor distance between the actual partial discharge and the first sensor based on the predetermined sensor distance, the distance associated with the first discharge curve and the distance associated with the second discharge curve.

In addition to the first sensor, the system therefore has a further sensor, specifically the second sensor. The second sensor is also designed to detect electrical signals. The first and second sensors can be fastened to the cable section at the predetermined sensor distance. The first sensor can preferably be fastened to a first end of the cable section and the second sensor can be fastened to a second, opposite end of the cable section. If a partial discharge occurs on the cable section, this causes a pulse-like signal that is detected as an electrical signal by the two sensors. However, due to the attenuation and the dispersion of the electrical cable section in particular, different electrical signals reach the two sensors. For example, if the distance from the partial discharge location to the first sensor is shorter than to the second sensor, the first discharge signal will have a larger amplitude in the high-frequency spectral component than the second discharge signal. Since the first discharge signal and the second discharge signal are often different in practice, an associated discharge curve can be respectively determined for each of the two discharge signals.

Provision is therefore preferably made for the data memory to have stored a second set of curves comprising a plurality of second curves, each with an associated distance to the second sensor. With regard to the second set of curves, the second curves and the associated distances, reference is made analogously to the advantageous explanations, preferred features, technical effects and/or advantages as have already been explained for the first set of curves, the first curves and the associated distances. In principle, provision can be made for the data memory to have therefore stored a first set of curves and a second set of curves. The two sets of curves can be different. However, it is also possible for the first set of curves and the second set of curves to be the same. In this case, the data memory may have stored a common set of curves forming both the first set of curves and the second set of curves. The same applies to the associated distances.

The second sensor can be designed analogously to the first sensor. For the second sensor, reference is therefore made analogously to the advantageous explanations, preferred features, technical effects and/or advantages as have been explained in connection with the first sensor. However, it should be pointed out that the first discharge signal and the second discharge signal are caused by the same actual partial discharge on the cable section. Due to the often different distance between the partial discharge location and the two sensors and/or due to different physical conditions, the first discharge signal mostly differs from the second discharge signal.

Provision is therefore also preferably made for the processor unit to be configured to determine the second discharge curve among the second curves in the second set of curves that best correlates with the second discharge signal. In addition, the processor unit can be configured to read out the distance associated with the second discharge curve from the data memory. The same can be provided for the first discharge curve. The first processor unit can thus be configured to read out the distance associated with the first discharge curve from the data memory. Ideally, an addition of the two distances read out results in the predetermined sensor distance between the two sensors. It follows from this that the first sensor distance, specifically the distance between the location of the actual partial discharge on the electrical cable section (partial discharge location) and the first sensor, is determined by the distance associated with the first partial discharge curve. Equally, however, the first sensor distance is also determined by subtracting the distance associated with the second discharge curve from the predetermined sensor distance. In this case, the processor unit may be configured to redundantly determine the first sensor distance based on the predetermined sensor distance, the distance associated with the first discharge curve and the distance associated with the second discharge curve. This is because the processor unit can be designed to carry out the aforementioned mathematical steps. If the difference between the predetermined sensor distance and the distance associated with the second discharge curve does not correspond to the distance associated with the first discharge curve, the first sensor distance can be determined, for example, by averaging the aforementioned difference and the distance associated with the first discharge curve. The processor unit can be configured accordingly. The first sensor distance can be determined even more precisely by considering the distances associated with the first and second discharge curves.

A further advantageous configuration of the system is distinguished by the fact that the system has a first pulse injection unit for injecting at least one first electrical pulse into the cable section. The processor unit is configured to change parameters of the cable model which represents a transmission behavior of electrical pulses over the cable section. The processor unit is also designed to control the first pulse injection unit such that electrical pulses referred to as first reference pulses are injected into the cable section by means of the first pulse injection unit, the first pulse injection unit being arranged at a distance from the first sensor. The first sensor is designed to detect electrical signals which are referred to as first reference signals and are caused by the first reference pulses. Furthermore, the first sensor is designed to directly or indirectly transmit a first test signal to the processor unit, wherein the first test signal represents the first reference signals. In addition, the processor unit is configured to adapt the parameters of the cable model based on the first test signal, with the result that the transmission behavior represented by the cable model corresponds to the actual transmission behavior of the cable section that is represented by the first reference pulses and the first reference signals.

In connection with the system, it has already been explained that the data memory can have stored a first set of curves comprising a plurality of first curves, wherein each first curve of these first curves in the first set of curves may be predetermined by means of a cable model of the cable section. For example, the cable model may be stored in the data memory of the system. In addition, the cable model can be loaded by the processor unit, for example, in order to execute it. The cable model can be changeable by means of parameters. Changing the parameters of the cable model makes it possible to change the modeled transmission behavior of electrical pulses over the cable section. The parameters of the cable model can be adapted, for example, in order to model a different attenuation and/or dispersion behavior of the cable section using the cable model. The parameters can be used, for example, to cause frequency-specific attenuation and/or location-specific attenuation and/or frequency-specific dispersion and/or frequency-specific dispersion. Because the processor unit is configured to change the parameters of the cable model, the transmission behavior of the cable section can be adapted particularly precisely to the actual transmission behavior of the cable section. Predetermined parameters can be used for the first use of the cable model. However, in order to adapt the parameters of the cable model to the actual transmission behavior and thus to achieve precise modeling, test signals are advantageous.

The processor unit is therefore designed to control the first pulse injection unit such that electrical pulses referred to as first reference pulses are injected into the cable section by means of the first pulse injection unit. This injection preferably takes place at a distance from the first sensor. This distance between the first pulse injection unit and the first sensor can be predetermined and/or known. As previously explained, the first sensor detects electrical signals. The first sensor therefore also detects the electrical signal which is referred to as the first reference signal and is caused by the first reference pulse. In addition, the first sensor is designed to transmit a test signal to the processor unit, wherein the first test signal represents the first reference signal. Usually the first reference signal is an analog signal. In order to avoid impairing the information content, the first sensor can be designed to digitize the first reference signal in order to form the first test signal therefrom. In addition, the first sensor is designed to transmit the first test signal to the processor unit.

In addition, the processor unit can be coupled to the pulse injection unit in such a way as to send a control signal to the first pulse injection unit so that the first reference pulse is injected into the cable section. The control signal can represent the first reference pulse. Alternatively or additionally, it is possible for the processor unit to at least temporarily store data that represent the first reference pulse. Alternatively or additionally, it is possible for a signal to be sent from the pulse injection unit to the processor unit after the first reference pulse has been injected, with this signal representing the first reference pulse.

Injecting the first reference pulse causes the first reference signal which is detected by the first sensor. The processor unit can therefore be configured to determine the actual transmission behavior of the cable section based on the first reference pulse and the first reference signal. Since the location at which the pulse injection unit injects the first reference pulse into the cable section is known, the cable model can also be used to model a transmission behavior which is represented by the cable model and would occur if a pulse corresponding to the first reference pulse were injected into the the cable section modeled by the cable model at the theoretically same location. Against this background, the processor unit is therefore configured to adapt the parameters of the cable model based on the first test signal in such a way that the transmission behavior represented by the cable model corresponds to the actual transmission behavior of the cable section that is represented by the first reference pulses and the first reference signals. This applies at least when the cable section is modeled for this purpose by the processor unit using the cable model in such a way that pulses that correspond to the first reference pulses are injected into the modeled cable section, with the result that auxiliary signals corresponding to the first reference signals are generated using the cable model. This is because, with these auxiliary signals and the aforementioned pulses, the transmission behavior represented by the cable model can be compared in a corresponding manner with the actual transmission behavior of the cable section. The parameters of the cable model are adapted here in such a way that the smallest possible difference arises between the transmission behavior represented by the cable model and the actual transmission behavior of the cable section. The difference preferably relates here to the amplitude response and/or the frequency response.

Adapting the parameters of the cable model therefore makes it possible for the cable model to be adapted particularly easily to the actual conditions of the actual cable section. This applies in particular to the initial start-up. However, it is also possible for the cable model to be adapted several times during operation by changing the parameters. In practice, it can happen that strong partial discharges cause the attenuation and/or the dispersion of the cable section to change at certain points. This attenuation and/or dispersion can change in particular with regard to the amplitude response or with regard to the frequency response. These changes can be taken into account by adapting the parameters of the cable model. If a new adaptation of the parameters of the cable model is carried out by means of the processor unit, the processor unit can be configured to redetermine the first set of curves and/or the second set of curves. In addition, the processor unit can be configured to store the new, first set of curves in the data memory. The same can apply to the new, second set of curves and to the distances. This in turn makes it possible for the first sensor distance to continue to be determined particularly precisely during ongoing operation, specifically in particular when the cable section is subject to changes.

The parameters of the cable model can influence the transmission behavior, for example with regard to an amplitude response, a phase response, a group delay, a phase delay, a relative permittivity of the cable section and/or other properties of the cable section. This allows the cable model to be adapted particularly precisely to the actual cable section.

It has proven to be advantageous if the first sensor at one end of the cable section and the first pulse injection unit injects the first reference pulse at the opposite end of the cable section. This is because in this case the first reference pulse must be transmitted through the entire line section before a corresponding first reference signal caused by this first reference pulse is detected by the first sensor. This first reference signal is therefore particularly advantageously suitable for adapting the parameters of the cable model.

It has already been explained above that provision may preferably be made for the system to have two sensors, specifically the first sensor and the second sensor. In addition, provision is preferably made for the first sensor to be arranged at one end of the cable section and for the second sensor to be arranged at the opposite end of the cable section. As explained above, the first reference pulse is preferably injected at this opposite end.

One advantageous configuration of the system is distinguished by the fact that the system has a second pulse injection unit for injecting at least one second electrical pulse into the cable section. The processor unit is designed to control the second pulse injection unit such that electrical pulses referred to as second reference pulses are injected into the cable section by means of the second pulse injection unit, the second pulse injection unit being arranged at a distance from the second sensor. The second sensor is designed to detect electrical signals which are referred to as second reference signals and are caused by the second reference pulses. Furthermore, the second sensor is designed to directly or indirectly transmit a second test signal representing the second reference signals to the processor unit. The processor unit is configured to adapt the parameters of the cable model based on the first test signal and the second test signal, with the result that the transmission behavior represented by the cable model corresponds to the actual transmission behavior of the cable section that is represented by the first reference pulses and the first reference signals and/or by the second reference pulses and second reference signals.

For the second pulse injection unit, the second reference pulse, the second reference signal and the second test signal, reference is made analogously to the previous explanations, preferred features, technical effects and/or advantages as have been explained in connection with the first pulse injection unit, the first reference pulses, the first reference signals and the first test signal. However, it should be noted that the second pulse injection unit is arranged at a distance from the second sensor. For example, the second pulse injection unit can be arranged in such a way that the second pulse injection unit injects the second reference pulses at the same end at which the first sensor is also arranged. The second sensor is preferably arranged at the opposite end of the cable section, where the first pulse injection unit preferably also injects the first reference pulses. The reference pulses injected by the second pulse injection unit must therefore be transmitted by the cable section to the second sensor at the opposite end, where they are detected as second reference signals. However, the reference pulses injected are subject to frequency-dependent and/or amplitude-dependent attenuation and/or dispersion as a result of the transmission.

In principle, the second test signal can be used in a similar manner to the first test signal in order to adapt the parameters of the cable model. However, the parameters of the cable model can be adapted even more precisely if this adaptation is made based on the first test signal and the second test signal. The adaptation can be carried out in this case by the processor unit in such a way that the transmission behavior represented by the cable model corresponds to the actual transmission behavior of the cable section that is represented by the first reference pulses and the first reference signals, and to the actual transmission behavior of the cable section that is represented by the second reference pulses and the second reference signals. As previously explained, the first set of curves and/or the second set of curves, which are preferably stored in the data memory, can be updated through the appropriately precise adaptation of the parameters of the cable model. This in turn allows the first sensor distance to be determined in a particularly precise manner.

One advantageous configuration of the system is distinguished by the fact that the first sensor and the second pulse injection unit are in the form of a common, first converter unit. The first converter unit can be designed to be arranged and/or fastened at one end of the cable section. A further configuration of the system is distinguished by the fact that the second sensor and the first pulse injection unit are in the form of a common, second converter unit. The second converter unit can be designed to be arranged and/or fastened at a further end of the cable section. Thus, the first and second converter units can be arranged and/or fastened at opposite ends of the electrical cable section.

A further advantageous configuration of the system is distinguished by the fact that the processor unit is configured, the first and/or second pulse injection unit is designed to periodically inject reference pulses and, after each injection of the reference pulses, to adapt the parameters of the cable model.

The periodic injection of reference pulses, preferably the periodic injection of first reference pulses and/or the periodic injection of second reference pulses, allows the cable model to be updated periodically. This means that the first set of curves and/or the second set of curves can also be updated periodically. The same applies to the associated distances. The processor unit can be configured accordingly for this purpose. The periodic updating of the cable model and/or the set of curves or sets of curves makes it possible to detect the first sensor distance in a particularly precise and in each case up-to-date manner.

A further advantageous configuration of the system is distinguished by the fact that the first sensor is designed to periodically detect electrical signals of the cable section. The processor unit is also preferably configured to determine the associated first discharge curve in each case when the electrical signal detected by the first sensor forms a first discharge signal and to determine the first sensor distance between the first sensor and the respective partial discharge based on the first discharge curve.

Provision can therefore preferably be made for the first sensor distance to be determined in an event-controlled manner, specifically whenever the electrical signal detected by the first sensor forms a first discharge signal. This makes it possible to determine the first sensor distance for each detected partial discharge on the cable section.

A further advantageous configuration of the system is distinguished by the fact that the second sensor is designed to periodically detect electrical signals of the cable section. The processor unit is also preferably configured to determine the associated second discharge curve in each case when the electrical signal detected by the second sensor forms a second discharge signal and to determine the first sensor distance between the respective partial discharge and the first sensor based on the predetermined sensor distance, the distance associated with the first discharge curve and the distance associated with the second discharge curve. In order to determine the first sensor distance, it has already been established previously that, when the system has the first and second sensors, the first sensor distance can be determined particularly precisely if the distance associated with the first discharge curve, the distance associated with the second discharge curve and the predetermined sensor distance between the two sensors are used. This first sensor distance can therefore also be determined in an event-controlled manner, specifically in each case when the electrical signals detected by the first and second sensors form associated discharge signals.

A further advantageous configuration of the system is distinguished by the fact that the processor unit is configured to determine a frequency of a plurality of actual partial discharges at the same distance to the first sensor, wherein the output signal also represents the frequency.

Because the processor unit is configured to determine the first and/or second discharge curve, it is possible for even weak partial discharges to be detected and taken into account, and for a first sensor distance to be determined in each case for this purpose. If a plurality of weak partial discharges occur at the same partial discharge location, and thus at the same first sensor distance to the first sensor, this can in practice result in this plurality of weak partial discharges having a similar adverse effect on the cable section as a single, particularly strong partial discharge. The frequency of a plurality of actual partial discharges, which each occur at the same first sensor distance to the first sensor on the cable section, is therefore particularly relevant information in practice. Transmitting the frequency of such partial discharges by means of the output signal therefore advantageously makes it possible to precisely monitor the condition of the cable section.

A further advantageous configuration of the system is distinguished by the fact that the processor unit is configured to determine at least one characteristic variable of a plurality of actual partial discharges at the same distance to the first sensor, wherein the output signal also represents the determined characteristic variable.

The characteristic variable can represent a property of the partial discharges. For example, the characteristic variable can represent the energy of the partial discharges. However, the energy of the partial discharges can be only one of many pieces of information that can be determined from the spectral composition of the partial discharges. The processor unit can be designed to carry out a source-filter separation in order to determine the characteristic variable.

A further advantageous configuration of the system is distinguished by the fact that the processor unit is configured to generate a warning signal if the frequency of the partial discharges is greater than a predetermined threshold frequency and/or if the determined characteristic variable of the partial discharges is greater than a predetermined threshold characteristic variable, wherein the signal interface is designed to transmit the warning signal.

It was already explained above that the frequency of partial discharges that occur at the same first sensor distance to the first sensor can result in damage to the cable section. The frequency of these partial discharges can be a measure of the damage in this case. It is therefore advantageous that a warning signal is generated if the frequency is greater than the predetermined threshold frequency. The threshold frequency can be predetermined in such a way that the warning signal is generated in good time before the damage to the cable section becomes too great. The characteristic variable can be taken into account in an analogous manner, specifically if the characteristic variable is greater than a predetermined threshold characteristic variable. In this case too, there is the risk of damage to the cable section, and so a corresponding warning signal must be generated.

A further advantageous configuration of the system is distinguished by the fact that the processor unit is configured to determine a state of health of the cable section based on the frequency of the partial discharges and/or the at least one determined characteristic variable of the partial discharges and/or the adapted parameters, wherein the output signal also represents the state of health.

The state of health of the cable section can be determined depending on the number and/or extent of damage to the cable section. The processor unit can be configured accordingly for the determination. If there is a high frequency of partial discharges, this indicates an advancing state of health. The same can be determined based on the characteristic variable. The processor unit can also be configured to adapt the parameters of the cable model based on the state of health.

A further advantageous configuration of the system is distinguished by the fact that the cable section has a plurality of cable segments which are arranged one behind the other along the cable section, wherein ends of cable segments which are opposite one another on the end faces are connected to one another in order to form coupling points. Each cable segment is assigned a first sensor and a first set of curves for the respective first sensor, with the result that the system has a plurality of first sensors and a plurality of first sets of curves are stored by the data memory. The processor unit is preferably configured to determine the cable segment with the partial discharge as an identified cable segment based on the first sensor distances. The signal interface is preferably designed to provide the output signal which indicates the identified cable segment and represents the first sensor distance between the first sensor of the identified cable element and the partial discharge.

In practice it can happen that a partial discharge occurs in one of the cable segments. However, the cable segment in which the partial discharge occurs is coupled to the other cable segments. The partial discharge therefore causes an electrical pulse that spreads across all cable segments and is therefore also detected at all first sensors. In order to prevent accidentally assuming that a partial discharge has taken place in each of the cable segments, the cable segment with the actual partial discharge is determined as an identified cable segment based on the first sensor distances by means of the processor unit. The remaining first sensor distances are discarded. In addition, provision is preferably made for the output signal provided by the signal interface to indicate the identified cable segment and to represent the first sensor distance to the first sensor of the identified cable segment. This makes it possible to determine the first sensor distance in a particularly precise and unambiguous manner and thus to also unambiguously determine the partial discharge location along the entire cable section. The processor unit can be configured accordingly for this purpose.

According to a second aspect of the disclosure, a transmission system for transmitting electrical energy is provided, wherein the transmission system has a cable section and a system. The system is in this case the system according to the first aspect of the disclosure and/or one of the associated advantageous configurations. With regard to the system, reference is made analogously to the previous explanations, preferred features, technical effects and/or advantages as have already been explained for the first aspect of the disclosure or one of the associated advantageous configurations.

According to a third aspect of the disclosure, a method for operating a system for an electrical cable section for transmitting electrical energy is provided, wherein the system has a first sensor for detecting electrical signals of the cable section, a processor unit, a data memory, and a signal interface. The data memory has, stored therein, a first set of curves comprising a plurality of first curves, each with an associated distance to the first sensor. Each first curve represents a pulse response of an electrical pulse, which is predetermined by means of a cable model of the cable section, as a result of a modeled partial discharge at the distance to the first sensor associated with the respective first curve on the cable section. In addition, the method has the following steps a) to e): In step a), electrical energy is transmitted by means of the cable section. In step b), an electrical signal which is referred to as the first discharge signal and is caused by an actual partial discharge on the cable section is detected by means of the first sensor. In step c), a first measurement signal representing the first discharge signal is directly or indirectly transmitted from the first sensor to the processor unit. In step d), a first curve in the first set of curves, which, among the first curves in the first set of curves, best correlates with the first discharge signal, is determined as the first discharge curve, based on the first measurement signal and by means of the processor unit. In step e), a first sensor distance between the actual partial discharge and the first sensor is determined based on the distance associated with the first discharge curve by means of the processor unit.

The steps of the method correspond to the features of the system according to the first aspect of the disclosure. For the method according to the third aspect of the disclosure, reference is therefore made analogously to the advantageous explanations, preferred features, technical effects and/or advantages as have already explained for the system according to the first aspect of the disclosure. There is therefore no repetition.

In addition, with regard to the advantageous configurations of the method which are described below, reference is made analogously to the explanations, preferred features, technical effects and advantages as have already been explained for the corresponding advantageous configurations of the system. Here too, there is no similar repetition.

One advantageous configuration of the method is distinguished by the fact that the system has a second sensor for detecting electrical signals of the cable section, wherein the data memory has stored a second set of curves comprising a plurality of second curves, each with an associated distance to the second sensor. Each second curve represents a pulse response of an electrical pulse, which is predetermined by means of the cable model of the cable section, as a result of a modeled partial discharge at the distance to the second sensor associated with the respective second curve on the cable section. The first sensor and the second sensor are arranged at a predetermined sensor distance from one another on the cable section. In addition, the method has the following further steps d.1) to d.3): In step d.1), an electrical signal which is referred to as the second discharge signal and is caused by the same actual partial discharge on the cable section is detected by means of the second sensor. In step d.2), a second measurement signal representing the second discharge signal is directly or indirectly transmitted from the second sensor to the processor unit. In step d.3), a second curve in the second set of curves, which, among the second curves in the second set of curves, best correlates with the second discharge signal, is determined as the second discharge curve, based on the second measurement signal and by means of the processor unit. The first sensor distance is additionally determined in step e) based on the distance associated with the second discharge curve by means of the processor unit.

A further advantageous configuration of the method is distinguished by the fact that the system has a first pulse injection unit for injecting at least one first electrical pulse into the cable section. The processor unit is configured to change parameters of the cable model which represents a transmission behavior of electrical pulses over the cable section. The first pulse injection unit is arranged at a distance from the first sensor. Furthermore, the method has the following further steps f) to i): In step f), the first pulse injection unit is controlled by means of the processor unit such that electrical pulses referred to as first reference pulses are injected into the cable section by means of the first pulse injection unit. In step g), electrical signals which are referred to as first reference signals and were each caused by one of the first reference pulses are detected by means of the first sensor. In step h), first test signals each representing one of the first reference signals are directly or indirectly transmitted from the first sensor to the processor unit. In step i), the parameters of the cable model are adapted by means of the processor unit and based on the at least one first test signal, with the result that the transmission behavior represented by the cable model corresponds to the actual transmission behavior of the cable section that is represented by the first reference pulses and the first reference signals.

A further advantageous configuration of the method is distinguished by the fact that the system has a second pulse injection unit for injecting at least one second electrical pulse into the cable section, wherein the second pulse injection unit is arranged at a distance from the second sensor. Furthermore, the method has the following further steps j) to l): In step j), the second pulse injection unit is controlled by means of the processor unit such that electrical pulses referred to as second reference pulses are injected into the cable section by means of the second pulse injection unit. In step k), an electrical signal which is referred to as the second reference signal and is caused by the second reference pulses is detected by means of the second sensor. In step l), a second test signal representing the second reference signal is directly or indirectly transmitted from the second sensor to the processor unit. In addition, the parameters of the cable model are adapted in step j) by means of the processor unit based on the first test signal and the second test signal, with the result that the transmission behavior represented by the cable model corresponds to the actual transmission behavior of the cable section that is represented by the first reference pulses and the second reference signals and/or by the second reference pulses and second reference signals.

A further advantageous configuration of the method is distinguished by the fact that the method has the following further step m): In step m), an output signal representing the first sensor distance is transmitted by means of the signal interface.

A further advantageous configuration of the method is distinguished by the fact that the group of method steps a) to e) is carried out once or repeatedly.

A further advantageous configuration of the method is distinguished by the fact that steps g) to j) or steps g) to m) are carried out once, periodically, after or before each execution of the group of method steps a) to e).

A further advantageous configuration of the method is distinguished by the fact that the first and/or second set of curves is calculated with the cable model updated by the adapted parameters by means of the processor unit and stored in the data memory, preferably after each adaptation of the parameters of the cable model.

Further features, advantages and possible applications of the present disclosure can be found in the following description of the exemplary embodiments and in the figures. Here, all features described and/or illustrated in the figures form the subject matter of the disclosure alone and in any desired combination even irrespective of their composition in the individual claims or their dependency references. In the figures, the same reference signs continue to stand for the same or similar objects.

FIG. 1 schematically illustrates one advantageous configuration of the system 2. The system 2 comprises a first sensor 6, a processor unit (processor) 8, a data memory 10, and a signal interface 12. The first sensor 6 is designed to detect an electrical signal of the cable section 4. Therefore, the system 2 is also used for an electrical cable section 4 which is used to transmit electrical energy.

In principle, the first sensor 6 may be in the form of an individual sensor 6 or an integral part of a further device. For example, in practice, high-frequency converters are often fastened to the ends of the cable section, with the first sensor 6 being able to be part of such a high-frequency converter.

The electrical cable section 4 can also be designed and/or referred to as an electrical cable. The electrical cable section 4 often has an electrically conductive core, for example made of copper, and insulation that encases the core. If an electrical signal is transmitted via the conductive core, the first sensor 6 can be designed, for example, to contactlessly detect the electrical signal. Alternatively, however, it is also possible for the sensor 6 to have electrical contact with the electrically conductive core of the cable section 4, with the result that the first sensor 6 is designed to detect electrical signals of the cable section 4 via this electrical contact.

The first sensor 6 is preferably coupled to the processor unit 8 via a signal connection 58. The processor unit 8 can in turn be coupled to the data memory 10 via a further signal connection 60 in order to read out data from the data memory 10 or to store data in the data memory 10. In addition, provision is preferably made for the processor unit 8 to be connected to the signal interface 12 via a further signal connection 62. The signal interface 12 is used to transmit an output signal U. The processor unit 8 can control the signal interface 12, for example, via the further signal line 62 so as to send the output signal U. The signal interface 12 can form an integral part of the processor unit 8. The processor unit 8 and the signal interface 12 can thus form a common unit. It is also possible for the data memory 10 to be assigned to this common unit. In other words, it is possible to provide a common unit which comprises the processor unit 8, the data memory 10 and the signal interface 12.

A partial discharge 22 can occur when electrical energy is transmitted using a cable section 4, in particular if the electrical energy is transmitted with a particularly high electrical voltage. The partial discharge 22 can take place at a partial discharge location T. The partial discharge 22 causes a pulse 20 which extends in the axial direction L of the cable section 4 in opposite directions. If the partial discharge location T is at a first sensor distance E to the first sensor 6, a certain transit time is required before the pulse 20 reaches the first sensor 6 from the partial discharge location T. However, using the transit time to determine the partial discharge location T has proven to be error-prone in practice. The pulse 20 caused by the partial discharge 22 is illustrated purely as an example in FIG. 2. In this case, the amplitude A of the pulse 20 is numbered to one. Due to the physical properties of the cable section 4, the pulse 20 is subject to location-dependent and/or frequency-dependent attenuation and/or dispersion. The signal waveform changes on the basis of the first sensor distance E between the partial discharge location T and the first sensor 6 in the manner illustrated schematically in FIG. 2.

Figure 2:
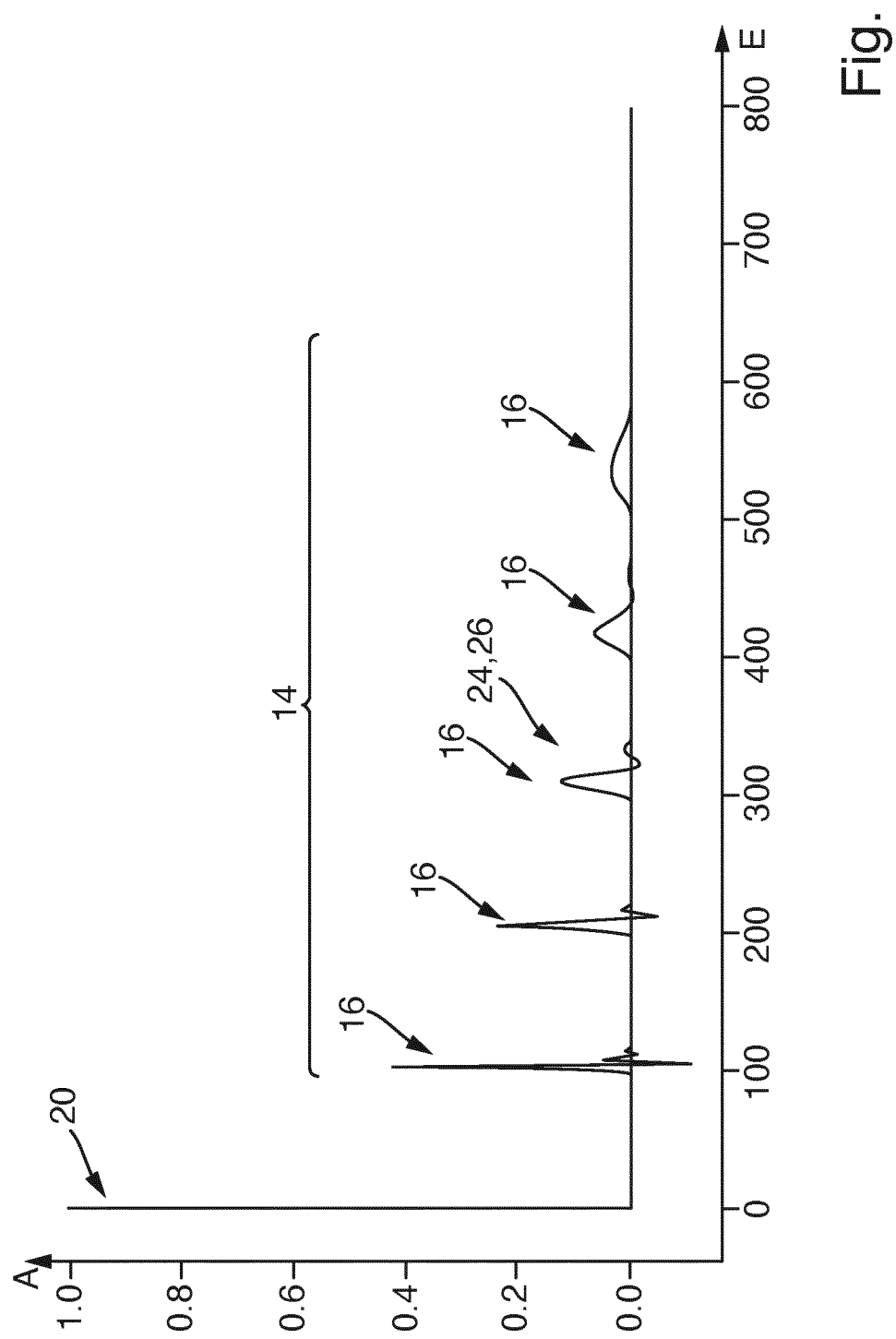
FIG. 2 shows a plurality of curves in a common set of curves.

If it is assumed, purely by way of example, that the length of the cable section 4 is approximately 800 m, the change in the pulse 20 on the basis of the distance covered or on the basis of the first sensor distance E is illustrated in FIG. 2. If the partial discharge T occurs, for example, at a first sensor distance E of 100 m from the first sensor 6, the first sensor 6 will be able to detect an electrical signal that corresponds, at least in terms of shape, to the curve 16 that is plotted in FIG. 2 for the first sensor distance E of 100 m. If the partial discharge 22 occurs at a partial discharge location T that is further away, for example 200 m away from the first sensor 6, the first sensor distance E is 200 m. In this case, the sensor 6 will be able to detect an electrical signal that corresponds to the curve 16 for the first sensor distance E of 200 m. In other words, the electrical signal detected in this case will have the shape, up to a proportional factor, that the curve 16 has for the first sensor distance E of 200 m. The further curves 16 from FIG. 2 result in the case of partial discharges 22 with a first sensor distance E of 300 m, 400 m or 500 m.

It can be seen from FIG. 2 that the curves 16 differ in terms of their frequency response and in terms of their amplitude response on the basis of the first sensor distance E. Therefore, the first sensor distance E can also be determined, independently of the transit time of the first pulse 20, using the waveform of the signal measured by the first sensor 6. To make this possible, the data memory 10 stores a first set of curves 14 comprising a plurality of first curves 16, each with an associated distance to the first sensor 6, wherein each first curve 16 represents a pulse response of an electrical pulse 20, which is predetermined by means of a cable model of the cable section 4, as a result of a modeled partial discharge 22 at a distance to the first sensor 6 associated with the respective first curve 16 on the cable section 4.

The use of a cable model of the cable section 4 offers the advantage that the cable section 4 does not have to be partially destroyed by partial discharges 22 in order to obtain the information relating to the first curves 16 . Rather, the cable model can be used to produce a pulse 20 at any point on the modeled cable section 4, and the same cable model can be used to determine the first curve 16 which would be measured at the respective distance between the pulse acting on the modeled cable section 4 and the location of the first sensor 6. A multiplicity of first curves 16 can thus be predetermined using the cable model by varying the distance to the location of the sensor 6. The processor unit 8 can be configured for this purpose. These first curves 16 together form the first set of curves 14. This set of curves 14 is stored in the data memory 10. In this case, data that represent the first set of curves 14 or the first curves 16 can actually be stored in the data memory 10. The same applies to the associated distances.

The first curves 16 in the first set of curves 14 can then be compared with an electrical signal from the first sensor 6 which is arranged on the actual cable section 4 for the purpose of detecting the electrical signals. In this case, that curve 16 which best correlates with or matches the electrical signal actually detected by means of the first sensor 6 can be determined. In addition, an associated distance for each first curve 16 is stored in the data memory 10. If one of the curves 16, which, among the first curves 16 in the first set of curves 14, correlates best with the discharge signal 24 actually detected by the sensor 6, was therefore determined as the first discharge curve 26, the distance associated with the first discharge curve 26, for example the first sensor distance E of 300 m, can be determined by means of the first curves 16 and associated distances stored in the data memory 10.

For the system 2, provision is therefore made for the first sensor 6 to be designed to detect an electrical signal which is referred to as the first discharge signal 24 and is caused by an actual partial discharge 22 on the cable section 4. However, this first discharge signal 24 is usually an analog signal. The first sensor 6 is therefore preferably designed to digitize the first discharge signal 24 in order to determine, on the basis thereof, a first measurement signal M which represents the first discharge signal 24. The first sensor 6 can then transmit the first measurement signal M to the processor unit 8 via the signal connection 58, for example. The signal connection can be in the form of a wired signal connection 58 or a wireless signal connection 58. However, it is also possible for an optical signal connection to exist between the first sensor 6 and the processor unit 8, via which connection the first measurement signal M can be transmitted from the first sensor 6 to the processor unit 8.

The processor unit 8 is configured, based on the first measurement signal M, to determine one of the first curves 16 in the first set of curves 14, which, among the first curves 16 in the first set of curves 14, best matches the first discharge signal 24, as the first discharge curve 26. Which of the first curves 16 best matches the first discharge signal 24 can be determined using the cross-correlation between the first discharge signal 24 and the respective first curve 16. The first curve 16 which produces the greatest correlation value can be understood to best match the first discharge signal 24. The corresponding first curve 16 then forms the first discharge curve 26. An associated distance for this first discharge curve 26 is stored in the data memory 10. The processor unit 8 is coupled to the data memory 10 via the signal connection 60, with the result that the processor unit 8 can read out the corresponding distance for the first discharge curve 26 from the data memory 10. The processor unit 8 is therefore configured to determine a first sensor distance E between the actual partial discharge 22 and the first sensor 6 based on the distance associated with the first discharge curve 26. In the simplest case, the first sensor distance E corresponds to the distance which is associated with the first discharge curve 26 and is stored in the data memory 10. In the case shown in FIG. 1 and FIG. 2, the distance for the first discharge curve 26 stored in the data memory 10 is 300 m. Therefore, in this case, the first sensor distance E can be determined to be 300 m.

In order to provide this information relating to the first sensor distance E of 300 m, the system 2 has the signal interface 12 which is designed to transmit an output signal U which represents the first sensor distance E. This makes it possible to provide the information relating to the first sensor distance E for further components, devices and/or modules of the system 2.

Figure 3:
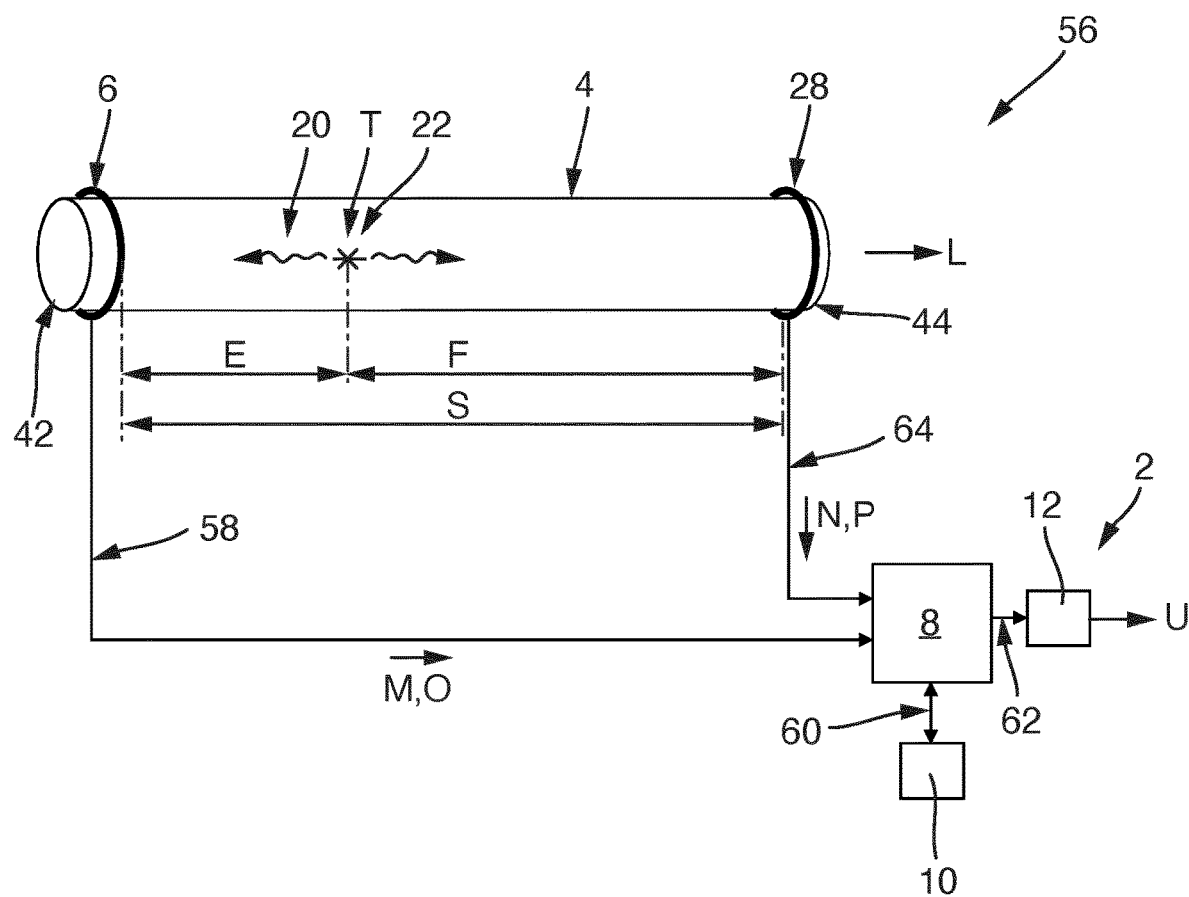
FIG. 3 shows a schematic illustration of a further advantageous configuration of the system.

FIG. 3 schematically illustrates a further advantageous configuration of the system 2. With regard to the system 2 from FIG. 3, reference is made analogously to the previous explanations of the system from FIG. 1. However, the system 2 from FIG. 3 has a further sensor 28 , specifically the second sensor 28. The first and second sensors 6, 28 can be arranged and/or fastened at opposite ends 42, 44 of the cable section 4. The second sensor 28 is preferably designed analogously to the first sensor 6. With regard to the second sensor 28, reference is therefore made to the advantageous explanations, preferred features, technical effects and/or advantages as have already been explained above for the first sensor 6.

The second sensor 28 is preferably coupled to the processor unit 8 via a further signal connection 64, with the result that a second measurement signal N can be transmitted from the second sensor 28 to the processor unit 8.

If a partial discharge 22 takes place on the cable section 4, the resulting pulse 20 is detected as an electrical signal at the first sensor 6 and as a further electrical signal at the sensor 28. However, the two detected electrical signals are different because the first sensor distance E does not correspond to the second sensor distance F. The different distances E, F result in different attenuation and/or dispersion, with the result that a first discharge signal 24 is detected by the first sensor 6 and a second discharge signal is detected by the second sensor 28. If the total length of the cable section 4 is 800 m, for example, the first discharge signal 24 can be transmitted to the processor unit 8 via the first measurement signal M. Based on the first discharge signal 24, the first processor unit 8 can read out a distance E of 300 m associated with the corresponding first curve 16 from the data memory 10. The data memory 10 may store a further set of curves, specifically a second set of curves comprising a plurality of second curves, each with an associated distance to the second sensor 28, wherein each second curve represents a pulse response of an electrical pulse, which is predetermined by means of the cable model of the cable section 4, as a result of a modeled partial discharge at the distance to the second sensor 28 associated with the respective second curve on the cable section 4. After the second measurement signal N representing the second discharge signal has been transmitted to the processor unit 8, the processor unit 8 can determine one of the second curves in the second set of curves, which, among the second curves, best matches the second discharge signal, as the second discharge curve. This second curve, referred to as the second discharge curve, is stored in the data memory 10 together with an associated distance. The processor unit 8 can therefore read out the associated distance from the data memory 10. The processor unit 8 is preferably configured for this purpose. The corresponding second sensor distance F can be 500 m, for example. If the two sensors 6, 28 are arranged at a sensor distance S of 800 m, the previously determined sensor distances, specifically the first sensor distance E of 300 m and the second sensor distance F of 500 m, correspond to the sensor distance S between the two sensors 6, 28 of 800 m. The processor unit 8 is therefore preferably configured to determine the first sensor distance E between the actual partial discharge 22 and the first sensor 6 based on the predetermined sensor distance S (800 m), the distance associated with the first discharge curve 26 (300 m) and the distance associated with the second discharge curve (500 m). In the example explained above, the first sensor distance E can be determined as redundant. However, if the distances E and F do not add up to form the sensor distance S, it can be determined by averaging the distance associated with the first discharge curve and the difference between the sensor distance and the distance associated with the second discharge curve. This makes it possible to determine the first sensor distance E in a particularly precise manner. Due to the first sensor distance E and the known location for the first sensor 6, the partial discharge location T is also known at the same time.

Figure 4:
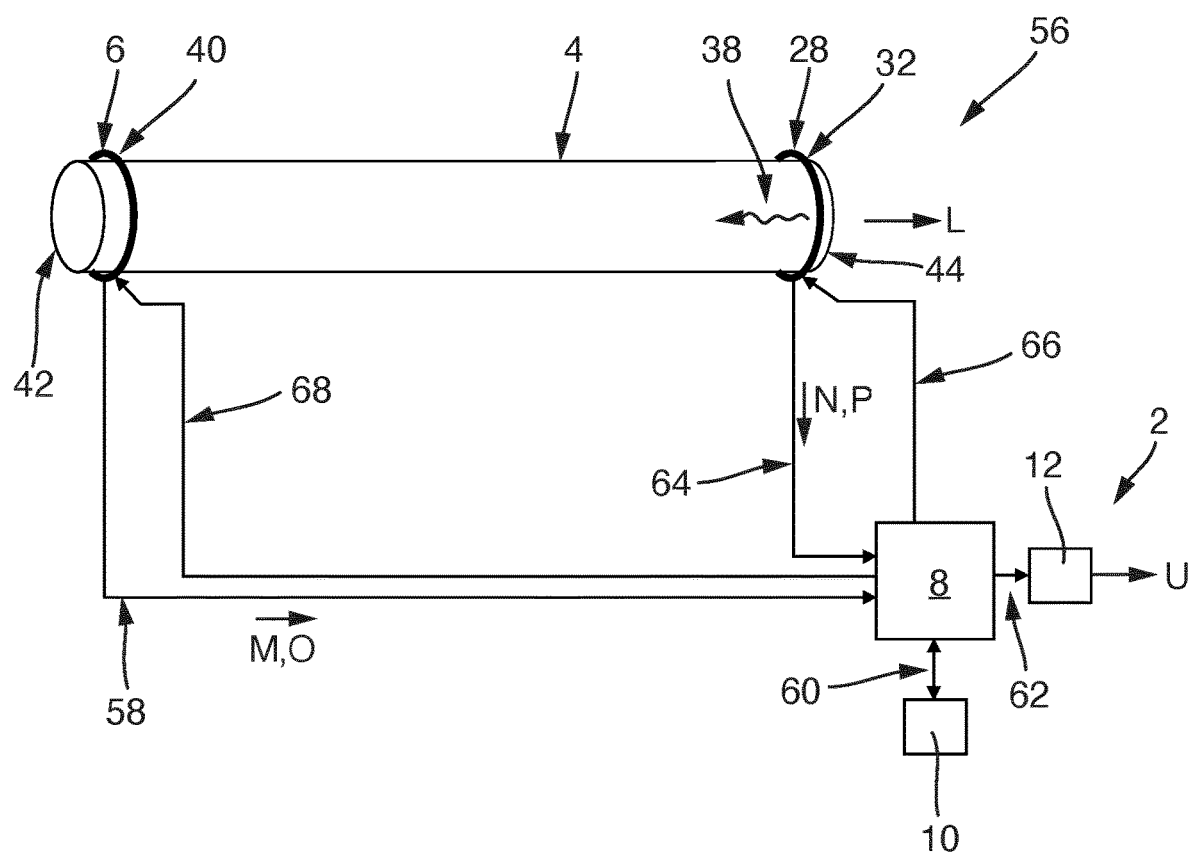
FIG. 4 shows a schematic illustration of a further advantageous configuration of the system.

FIG. 4 illustrates a further advantageous configuration of the system 2. The system 2 corresponds in this case at least substantially to the system 2 explained in FIG. 4. Reference is therefore made analogously to the corresponding explanations. The system 2 from FIG. 4 also has a first pulse injection unit (first pulse injector) 32. This can be formed together with the second sensor 28. The first pulse injection unit 32 and the second sensor 28 can therefore form a common unit.

In principle, the parameters of the cable model can be predetermined. For example, the parameters of the cable model can be predetermined in such a way that the cable model can use these parameters to determine first and/or second sets of curves for a multiplicity of structurally identical cable sections 4. In practice, however, the cable sections have minor to major differences from one another. The same set of parameters for a cable model for a multiplicity of cable sections therefore often allows only suboptimal modeling. In order to achieve better adaptation of the parameters to the respective cable section and thus better modeling of the cable section by means of the cable model, provision is preferably made for the parameters of the cable model to be adapted to the actual properties of the respective cable section 4. This can be carried out when the cable section is operated for the first time. However, it is also alternatively or additionally possible for the parameters of the cable model to be adapted periodically or adapted on the basis of specific events. Repeatedly adapting the parameter of the cable model during operation makes it possible for the adapted parameters of the cable model to be used to ensure better modeling of the cable section 4, which may also be subject to certain changes during operation. If, for example, a strong partial discharge has taken place on the cable section 4, with the result that the attenuation and/or dispersion properties of the cable section 4 change as a result, this can be modeled better by adapting the parameters of the cable model.

Provision is therefore preferably made for the system to have the first pulse injection unit 32 which is designed to inject at least one first electrical pulse into the cable section 4. In this case, the processor unit 8 is designed to control the first pulse injection unit 32 such that electrical pulses referred to as first reference pulses 38 are injected into the cable section 4 by means of the first pulse injection unit 32. The first pulse injection unit 32 is arranged at a distance from the first sensor 6. The first sensor 6 is specifically preferably arranged at the first end 42 of the cable section 4, whereas the first pulse injection unit 32 is arranged at the opposite end 44 of the cable section 4. This makes it possible to ensure that the first reference pulses 38 injected into the cable section 4 must run through the entire cable section 4 before they can be detected by the first sensor 6 as electrical signals. The first sensor 6 is therefore designed to detect electrical signals which are referred to as first reference signals and are caused by the first reference pulses 38. If a first reference pulse 38 is therefore injected into the cable section 4 by the first pulse injection unit 32, this first reference pulse 38 is subject to the attenuation and/or dispersion caused by the cable section 4. The first reference signal, which is detected by the first sensor 6, is therefore caused by the first reference pulse. In particular, the first reference signal can be the first reference pulse 38 attenuated by the cable section 4. The first reference signal is usually an analog signal. The first sensor 6 is therefore preferably designed to digitize each first reference signal. In addition, the first sensor 6 is designed to transmit a first test signal O to the processor unit 8 via the signal connection 58, wherein the first test signal O represents the first reference signals.

The processor unit 8 is preferably coupled to the first pulse injection unit 32 via the control line 66 in order to control the first pulse injection unit 32. The first reference pulse 38 is therefore also known to the processor unit 8. If the second sensor 28 and the first pulse injection unit 32 form a common unit, the first reference pulse 38 can be detected by the second sensor 28 and a corresponding signal can be transmitted to the processor unit 8 via the signal line 64 for checking purposes. As a result, the first reference pulse 38 is also known to the processor unit 8. The at least one first reference signal is also known to the processor unit 8 via the first test signal O from the first sensor 6 to the processor unit 8. The transmission behavior of the cable section 4 can therefore be determined in the usual way from a first reference pulse 38 injected into the cable section 4 and an associated first reference signal. The processor unit 8 can be designed accordingly for this purpose. The same transmission behavior should basically be possible with the cable model. However, when the cable section 4 is started up for the first time and/or due to changes in the cable section 4, it may be necessary to adapt the parameters of the cable model such that the transmission behavior represented by the cable model for the cable section 4 and the actual transmission behavior of the cable section 4, which can be determined from a first reference pulse and an associated first reference signal, match.

Therefore, the processor unit 4 is configured to adapt the parameters of the cable model based on the first test signal O, with the result that the transmission behavior represented by the cable model for the cable section 4 corresponds to the actual transmission behavior of the cable section 4 that is represented by the first reference pulses and the first reference signals.

The system 2 can also have a second pulse injection unit (second pulse injector) 40 which is also designed to inject electrical pulses into the cable section 4. The second pulse injection unit 40 can inject corresponding second reference pulses into the cable section 4, with the result that a second reference signal can be detected by the first sensor 6. The second pulse injection unit 40 can be used and operated together with the first sensor 6 in a manner analogous to that previously explained for the first pulse injection unit 32 and the second sensor 28. For example, it is possible for both pulse injection units 32, 40 to inject reference pulses into the cable section 4 in a parallel manner, with a time delay or alternately, and for corresponding reference signals to be detected by the sensors 6, 28. The reference pulses and reference signals can then be used to better determine the actual transmission behavior of the cable section 4.

The second pulse injection unit 40 can also be configured together with the first sensor 6. They may thus form a common unit.

Figure 5:
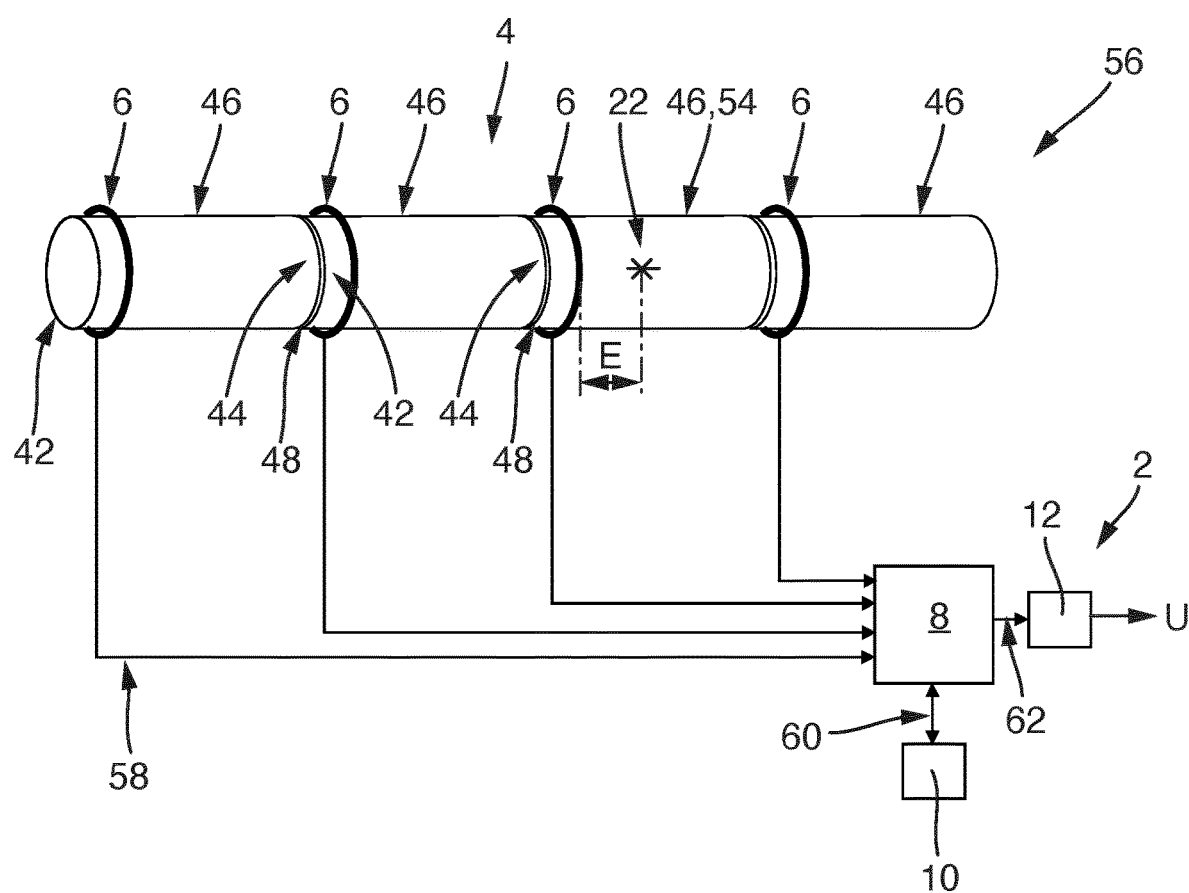
FIG. 5 shows a schematic illustration of a further advantageous configuration of the system.

FIG. 5 illustrates a further advantageous configuration of the system 2. With regard to the processor unit 8, the data memory 10 and the signal interface 12, reference is made analogously to the previous explanations. However, the system 2 is adapted for a cable section 4 having a plurality of cable segments 46 which are arranged one behind the other along the cable section 4, wherein the ends 44, 42 of the cable segments 46 which are opposite one another on the end faces are connected to one another in order to form coupling points 48. In this case, the coupling points 48 are designed in such a way that electrical energy can be transmitted from cable segment 46 to cable segment 46 via the coupling point 48.

The same configurations of the system 2 as have already been explained above in connection with FIGS. 1 to 4 can be provided for each cable segment 46. Therefore, for each cable segment 46, reference is made analogously to the previous explanations, preferred features, effects and advantages as explained in the context of the system 2 with the cable segment 4. There are therefore no analogous repetitions.

Each cable segment 46 is assigned a first sensor 6 which is preferably connected to the processor unit 8 via an associated signal line 58. In addition, each first sensor 6 is assigned a first set of curves which is stored in the data memory 10. The system 2 thus has a plurality of first sensors 6 and a plurality of first sets of curves 14. With reference to the previous explanations, the processor unit 8 is configured to determine the first sensor distance E to an actual partial discharge 22 for each first sensor 6.

If, for example, a partial discharge 22 occurs in one of the cable segments 46, this produces a pulse 20 that spreads over all cable segments 46 due to the coupling points 48 between the cable segments 46. In principle, this can result in the first sensors 6 of the cable segments 46 each detecting a first discharge signal which is caused by the same partial discharge 22 but has only taken place in one of the cable segments 46. The processor unit 8 is therefore configured to determine the cable segment 46 with the actual partial discharge 22 as an identified cable segment 54 based on the first sensor distances E. In other words, the processor unit 8 can initially determine a respective associated discharge curve and the first sensor distance E resulting therefrom based on the first discharge signals. An associated first sensor distance E can thus be determined for each cable segment 46. Based on this plurality of first sensor distances E, the processor unit 8 can then determine one of the cable segments 46 as an identified cable segment 54 on which the partial discharge 22 actually took place. The first sensor distance E assigned to this cable segment 46 then also forms the actual first sensor distance E which can be represented by the output signal U. The output signal U can additionally indicate the identified cable segment 46. Provision is therefore preferably made for the signal interface 12 to be designed to provide the output signal U which indicates the identified cable segment 54 and represents the first sensor distance E between the first sensor 6 of the identified cable segment 54 and the actual partial discharge 22.

A transmission system 56 can also be gathered from FIGS. 1, 3, 4 and 5. The transmission system 56 has the system 2. This is illustrated in different configurations in the aforementioned figures. The transmission system 56 also has the cable section 4 as such. For the transmission system 56, reference is therefore made analogously to the previous explanations, preferred features, effects and advantages.

Figure 6:
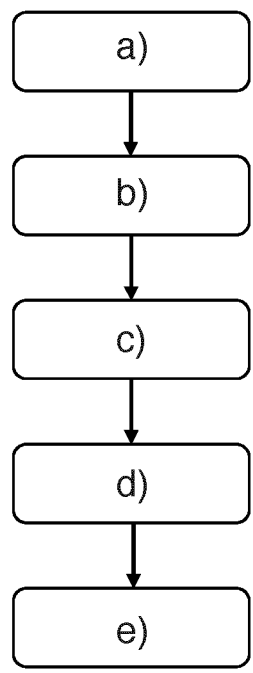
FIGS. 6, 7 and 8 each show advantageous flowcharts for the method.

FIG. 6 illustrates a flowchart for one advantageous configuration of the method for operating the system 2. In this case, the method has the following steps:

a) transmitting electrical energy by means of the cable section 4;

b) detecting an electrical signal, which is referred to as the first discharge signal 24 and is caused by an actual partial discharge 22 on the cable section 4, by means of the first sensor 6;

c) directly or indirectly transmitting a first measurement signal M representing the first discharge signal 24 from the first sensor 6 to the processor unit 8;

d) determining a first curve 16 in the first set of curves 14, which, among the first curves 16 in the first set of curves 14, best matches the first discharge signal 24, as the first discharge curve 26, based on the first measurement signal M and by means of the processor unit 8; and e) determining a first sensor distance E between the actual partial discharge 22 and the first sensor 6 based on the distance associated with the first discharge curve 26 by means of the processor unit 8.

With regard to the method, reference is made analogously to the previous explanations, preferred features, effects and/or advantages as have already been explained for the system 2 in relation to FIGS. 1-5. There is therefore no corresponding repetition.

However, it should be noted that method steps a) to e) can be carried out in the order mentioned.

Figure 7:
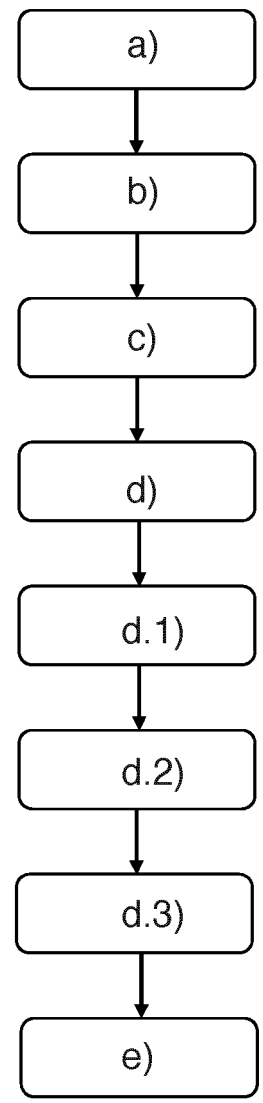

If the method is carried out with a system 2 as shown for example in FIG. 3, the following further steps d.1) to d.3) can be carried out between steps d) and e). FIG. 7 schematically illustrates a corresponding flowchart. The additional steps can be summarized as follows:

d.1) detecting an electrical signal, which is referred to as the second discharge signal and is caused by the same, actual partial discharge 22 on the cable section 4, by means of the second sensor 28;

d.2) directly or indirectly transmitting a second measurement signal N representing the second discharge signal from the second sensor 28 to the processor unit 8;

d.3) determining a second curve in the second set of curves, which, among the second curves in the second set of curves, best matches the second discharge signal, as the second discharge curve, based on the second measurement signal by means of the processor unit 8.

Provision is also preferably made for the first sensor distance E to be additionally determined in step e) based on the distance associated with the second discharge curve by means of the processor unit 8.

Figure 8:
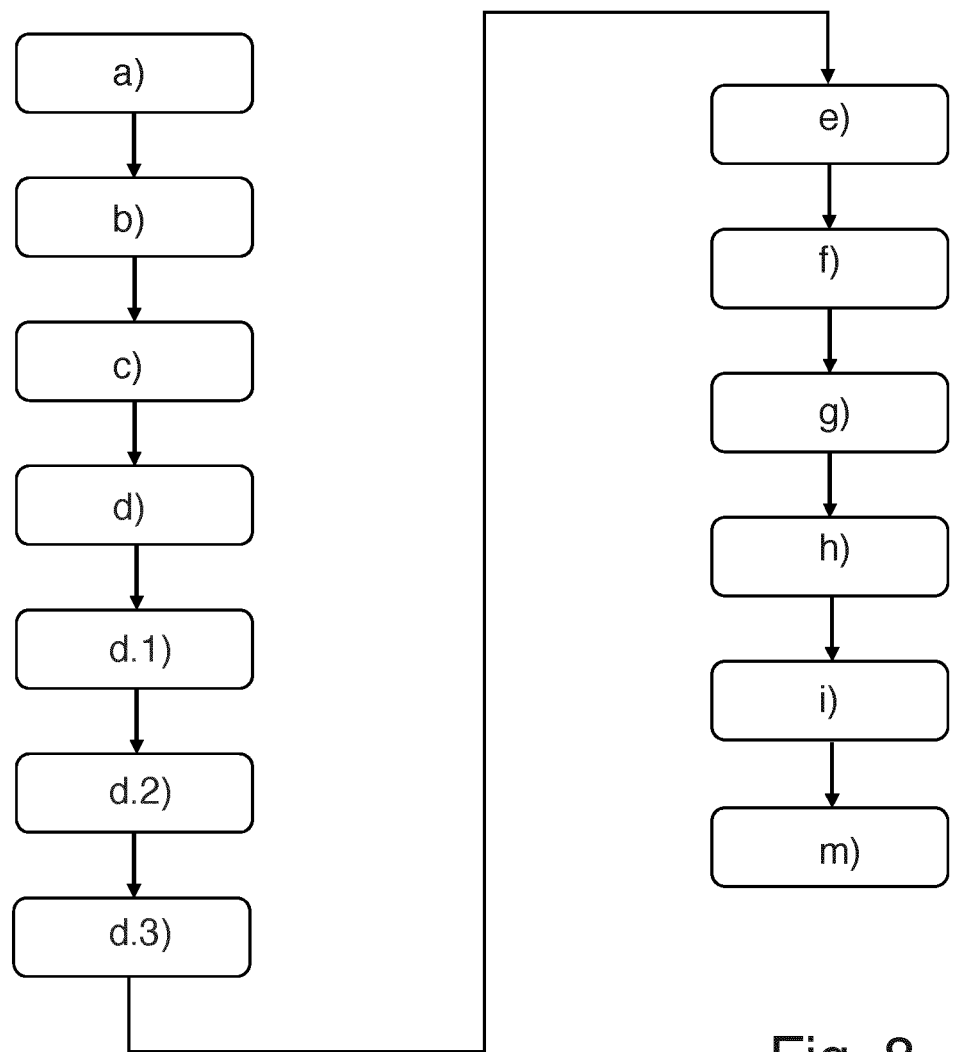

FIG. 8 shows a further configuration of the method by virtue of a schematic illustration of a flowchart. According to this configuration of the method, the method also has the following steps in addition to the steps as have been explained in connection with FIG. 7:

f) controlling the first pulse injection unit 32 by means of the processor unit 8 such that electrical pulses referred to as first reference pulses 38 are injected into the cable section 4 by means of the first pulse injection unit 32;

g) detecting first signals, which are referred to as first reference signals and are each caused by one of the first reference pulses 38, by means of the first sensor 6;

h) directly or indirectly transmitting first test signals O, which each represent one of the first reference signals, from the first sensor 6 to the processor unit 8;

i) adapting the parameters of the cable model 4 by means of the processor unit 8 and based on the at least one first test signal O, with the result that the transmission behavior represented by the cable model 4 corresponds to the actual transmission behavior of the cable section 4 that is represented by the first reference pulses 38 and the first reference signals.

In addition, each of the methods explained above in connection with FIGS. 6 to 8 can have the additional step m) which is also illustrated purely by way of example in the flowchart in FIG. 8. The method then specifically preferably also has the following step:

m) transmitting an output signal U representing the first sensor distance E by means of the signal interface 12.

In addition, it should be pointed out that "having" does not exclude any other elements or steps and "a" or "an" does not exclude a plurality. Furthermore, it should be pointed out that features that have been described with reference to one of the above exemplary embodiments can also be used in combination with other features of other exemplary embodiments described above. Reference signs in the claims should not be construed as a limitation.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

A Amplitude
M First measurement signal
N Second measurement signal
O First test signal
P Second test signal
E First sensor distance
F Second sensor distance
S Sensor distance
T Partial discharge location
U Output signal
L Axial direction
2 System
4 Cable section
6 First sensor
8 Processor unit
10 Data memory
12 Signal interface
14 First set of curves
16 First curve
20 Pulse
22 Partial discharge
24 First discharge signal
26 First discharge curve
28 Second sensor
32 First pulse injection unit
38 First reference pulse
40 Second pulse injection unit
42 First end
44 Second end
46 Cable segment
48 Coupling point
54 Identified cable segment
56 Transmission system
58 Signal connection
60 Signal connection
62 Signal connection
64 Signal connection
66 Control line
68 Control line

The invention claimed is:

1. A system for an electrical cable section for transmitting electrical energy, the system comprising:
a first sensor configured to detect electrical signals of the cable section;
a processor;
a data memory; and
a signal interface,
wherein the data memory has stored therein a first set of curves comprising a plurality of first curves, each with an associated distance to the first sensor, wherein each first curve represents a pulse response of an electrical pulse, which is predetermined by a cable model of the cable section, as a result of a modeled partial discharge at the distance to the first sensor associated with the respective first curve on the cable section,
wherein the first sensor is configured to detect an electrical signal, which is referred to as a first discharge signal and is caused by an actual partial discharge on the cable section, and to directly or indirectly transmit a first measurement signal M representing the first discharge signal to the processor,
wherein the processor is configured, based on the first measurement signal M, to determine one of the first curves in the first set of curves, which, among the first curves in the first set of curves, correlates best with the first discharge signal, as the first discharge curve, wherein the processor is configured to determine a first sensor distance E between the actual partial discharge and the first sensor based on the distance associated with the first discharge curve, wherein the signal interface is designed to transmit an output signal U which represents the first sensor distance E, wherein the system further comprises a first pulse injector configured to inject at least one first electrical pulse into the cable section, wherein the processor is configured to change parameters of the cable model which represents a transmission behavior of electrical pulses over the cable section, wherein the processor is configured to control the first pulse injector such that electrical pulses referred to as first reference pulses are injected into the cable section by the first pulse injector, wherein the first pulse injector is arranged at a distance from the first sensor, wherein the first sensor is configured to detect electrical signals, which are referred to as first reference signals and are caused by the first reference pulses, and to directly or indirectly transmit a first test signal O representing the first reference signals to the processor, and wherein the processor is configured to adapt the parameters of the cable model based on the first test signal O, with the result that the transmission behavior represented by the cable model corresponds to the actual transmission behavior of the cable section that is represented by the first reference pulses and the first reference signals.

2. The system as claimed in claim 1, wherein the system further comprises a second pulse injector configured to inject at least one second electrical pulse into the cable section, wherein the processor is configured to control the second pulse injector such that electrical pulses referred to as second reference pulses are injected into the cable section by the second pulse injector, wherein the second pulse injector is arranged at a distance from the second sensor, wherein the second sensor is configured to detect electrical signals, which are referred to as second reference signals and are caused by the second reference pulses, and to directly or indirectly transmit a second test signal P representing the second reference signals to the processor, and wherein the processor is configured to adapt the parameters of the cable model based on the first test signal O and the second test signal P, with the result that the transmission behavior represented by the cable model corresponds to the actual transmission behavior of the cable section that is represented by the first reference pulses and the first reference signals and/or by the second reference pulses and second reference signals.

3. The system as claimed in claim 2, wherein the first sensor and the second pulse injector are in the form of a common, first converter unit.

4. The system as claimed in claim 3, wherein the second sensor and a first pulse injector are in the form of a common, second converter unit.

5. The system as claimed in claim 1, wherein the processor is configured to control the first pulse injector or a second pulse injector to periodically inject reference pulses and, after each injection of the reference pulses, to adapt the parameters of the cable model.

6. The system as claimed in claim 1, wherein the first sensor is configured to periodically detect electrical signals of the cable section, and the processor is configured, in each case upon the electrical signal detected by the first sensor forming a first discharge signal, to determine the associated first discharge curve and to determine the first sensor distance E between the first sensor and the respective partial discharge based on the first discharge curve.

7. The system as claimed in claim 6, wherein the processor is configured to determine a frequency of a plurality of actual partial discharges at the same distance to the first sensor, and wherein the output signal U also represents the frequency.

8. The system as claimed in claim 6, wherein the processor is configured to determine at least one characteristic variable of a plurality of actual partial discharges at the same distance to the first sensor, and wherein the output signal U also represents the determined characteristic variable.

9. The system as claimed in claim 1, wherein a second sensor is configured to periodically detect electrical signals of the cable section, and the processor is configured, in each case upon the electrical signal detected by the second sensor forming a second discharge signal, to determine the associated second discharge curve and to determine the first sensor distance E between the respective partial discharge and the first sensor based on the predetermined sensor distance, the distance associated with the first discharge curve and the distance associated with the second discharge curve.

10. The system as claimed in claim 9, wherein the processor is configured to:
  either:
    determine a frequency of a plurality of the actual partial discharges at the same distance to the first sensor, and generate a warning signal upon the frequency of the partial discharges being greater than a predetermined threshold frequency;
  or:
    determine at least one characteristic variable of the plurality of the actual partial discharges at the same distance to the first sensor, and generate the warning signal upon the determined characteristic variable of the partial discharges being greater than a predetermined threshold characteristic variable, and wherein the signal interface is configured to transmit the warning signal.

11. The system as claimed in claim 9, wherein the processor is configured to:
  either:
    determine a frequency of a plurality of the actual partial discharges at the same distance to the first sensor, and determine a state of health of the cable section based on the frequency of the partial discharges;
  or:
    determine at least one characteristic variable of the plurality of the actual partial discharges at the same distance to the first sensor, and determine the state of health of the cable section based on the at least one determined characteristic variable of the partial discharges, and wherein the output signal U also represents the state of health.

12. The system as claimed in claim 1,
wherein the cable section further comprises a plurality of cable segments which are arranged one behind the other along the cable section, wherein ends of cable segments which are opposite one another on the end faces are connected to one another in order to form coupling points,
wherein each cable segment is assigned a respective first sensor and a first set of curves for the respective first sensor, with the result that the system has a plurality of first sensors and a plurality of first sets of curves are stored by the data memory,
wherein the processor is configured to determine, for each of the respective first sensors, the respective first sensor distance E between the actual partial discharge and the respective first sensor,
wherein the processor is configured to determine the cable segment with the partial discharge as an identified cable segment based on the respective first sensor distances E, and
wherein the signal interface is configured to provide the output signal U which indicates the identified cable segment and represents the respective first sensor distance E between the respective first sensor of the identified cable element and the partial discharge.

13. A transmission system for transmitting electrical energy, the transmission system comprising:
a cable section; and
the system as claimed in claim 1.

14. The system as claimed in the claim 1,
wherein the system further comprises a second sensor configured to detect the electrical signals of the cable section,
wherein the data memory further has stored therein a second set of curves comprising a plurality of second curves, each with an associated distance to the second sensor, wherein each second curve represents a pulse response of an electrical pulse, which is predetermined by the cable model of the cable section, as a result of a modeled partial discharge at the distance to the second sensor associated with the respective second curve on the cable section,
wherein the first sensor and the second sensor are configured to be fastened to the cable section at a predetermined sensor distance from one another,
wherein the second sensor is configured to detect an electrical signal, which is referred to as a second discharge signal and is caused by the same, actual partial discharge on the cable section, and to directly or indirectly transmit a second measurement signal N representing the second discharge signal to the processor,
wherein the processor is configured, based on the second measurement signal N, to determine one of the second curves in the second set of curves, which, among the second curves, correlates best with the second discharge signal, as the second discharge curve, and
wherein the processor is configured to determine the first sensor distance E between the actual partial discharge and the first sensor based on the predetermined sensor distance, the distance associated with the first discharge curve and the distance associated with the second discharge curve.

15. A method for operating a system for an electrical cable section for transmitting electrical energy, the system comprising a first sensor configured to detect electrical signals of the cable section, a processor, a data memory, and a signal interface, the data memory having stored therein a first set of curves comprising a plurality of first curves, each with an associated distance to the first sensor, wherein each first curve represents a pulse response of an electrical pulse, which is predetermined by a cable model of the cable section, as a result of a modeled partial discharge at the distance to the first sensor associated with the respective first curve on the cable section, the method comprising:
a) transmitting electrical energy via the cable section;
b) detecting an electrical signal, which is referred to as a first discharge signal and is caused by an actual partial discharge on the cable section, by the first sensor;
c) directly or indirectly transmitting a first measurement signal M representing the first discharge signal from the first sensor to the processor;
d) determining a first curve in the first set of curves, which, among the first curves in the first set of curves, correlates best with the first discharge signal, as a first discharge curve, based on the first measurement signal M and by the processor; and
e) determining a first sensor distance E between the actual partial discharge and the first sensor based on the distance associated with the first discharge curve by the processor,
wherein the system further comprises a first pulse injector configured to inject at least one first electrical pulse into the cable section, wherein the processor is configured to change parameters of the cable model which represents a transmission behavior of electrical pulses over the cable section, wherein the first pulse injector is arranged at a distance from the first sensor, and wherein the method further comprises:
f) controlling the first pulse injector by the processor such that electrical pulses referred to as first reference pulses are injected into the cable section by the first pulse injector;
g) detecting electrical signals, which are referred to as first reference signals and are each caused by one of the first reference pulses, by the first sensor;
h) directly or indirectly transmitting first test signals O, which each represent one of the first reference signals, from the first sensor to the processor; and
i) adapting the parameters of the cable model by the processor and based on at least one of the first test signals O, with the result that the transmission behavior represented by the cable model corresponds to the actual transmission behavior of the cable section that is represented by the first reference pulses and the first reference signals.

16. The method as claimed in the claim 15, wherein the system further comprises a second sensor configured to detect electrical signals of the cable section, wherein the data memory has stored therein a second set of curves comprising a plurality of second curves, each with an associated distance to the second sensor, wherein each second curve represents a pulse response of an electrical pulse, which is predetermined by the cable model of the cable section, as a result of a modeled partial discharge at the distance to the second sensor associated with the respective second curve on the cable section, wherein the first sensor and the second sensor are arranged at a predetermined sensor distance from one another on the cable section, and wherein the method further comprises:
d.1) detecting an electrical signal, which is referred to as a second discharge signal and is caused by the same, actual partial discharge on the cable section, by the second sensor;

d.2) directly or indirectly transmitting a second measurement signal N representing the second discharge signal from the second sensor to the processor;

d.3) determining a second curve in the second set of curves, which, among the second curves in the second set of curves, correlates best with the second discharge signal, as the second discharge curve, based on the second measurement signal N and by the processor; and e.1) determining the first sensor distance E based on the distance associated with the second discharge curve by the processor.

17. The method as claimed in claim 15, wherein the method further comprises:

m) transmitting an output signal U representing the first sensor distance E by the signal interface.

18. The method as claimed in claim 15, wherein the group of method steps a) to e) is carried out once or repeatedly.

19. A method for operating a system for an electrical cable section for transmitting electrical energy, the system comprising a first sensor configured to detect electrical signals of the cable section, a processor, a data memory, and a signal interface, the data memory having stored therein a first set of curves comprising a plurality of first curves, each with an associated distance to the first sensor, wherein each first curve represents a pulse response of an electrical pulse, which is predetermined by a cable model of the cable section, as a result of a modeled partial discharge at the distance to the first sensor associated with the respective first curve on the cable section, the method comprising:

a) transmitting electrical energy via the cable section;

b) detecting an electrical signal, which is referred to as a first discharge signal and is caused by an actual partial discharge on the cable section, by the first sensor;

c) directly or indirectly transmitting a first measurement signal M representing the first discharge signal from the first sensor to the processor;

d) determining a first curve in the first set of curves, which, among the first curves in the first set of curves, correlates best with the first discharge signal, as a first discharge curve, based on the first measurement signal M and by the processor; and e) determining a first sensor distance E between the actual partial discharge and the first sensor based on the distance associated with the first discharge curve by the processor, wherein the system further comprises a second sensor configured to detect electrical signals of the cable section, wherein the data memory has stored therein a second set of curves comprising a plurality of second curves, each with an associated distance to the second sensor, wherein each second curve represents a pulse response of an electrical pulse, which is predetermined by the cable model of the cable section, as a result of a modeled partial discharge at the distance to the second sensor associated with the respective second curve on the cable section, wherein the first sensor and the second sensor are arranged at a predetermined sensor distance from one another on the cable section, wherein the method further comprises:

d.1) detecting an electrical signal, which is referred to as the second discharge signal and is caused by the same, actual partial discharge on the cable section, by the second sensor;

d.2) directly or indirectly transmitting a second measurement signal N representing the second discharge signal from the second sensor to the processor;

d.3) determining a second curve in the second set of curves, which, among the second curves in the second set of curves, correlates best with the second discharge signal, as a second discharge curve, based on the second measurement signal N and by the processor; and e.1) determining the first sensor distance E based on the distance associated with the second discharge curve by the processor, wherein the system further comprises a first pulse injector configured to inject one or more first electrical pulses into the cable section, wherein the first pulse injector is arranged at a distance from the first sensor, wherein the system further comprises a second pulse injector configured to inject one or more second electrical pulses into the cable section, wherein the second pulse injector is arranged at a second distance from the second sensor, and wherein the method further comprises:

j) controlling the first pulse injector by the processor such that first electrical pulses referred to as first reference pulses are injected into the cable section by the first pulse injector, and controlling the second pulse injector by the processor such that second electrical pulses referred to as second reference pulses are injected into the cable section by the second pulse injector;

k) detecting first electrical signals, which are referred to as first reference signals and are each caused by one of the first reference pulses, by the first sensor, and detecting a second electrical signal, which is referred to as the second reference signal and is caused by the second reference pulses, by the second sensor;

l) and directly or indirectly transmitting first test signals O, which each represent one of first reference signals, from the first sensor to the processor, and directly or indirectly transmitting a second test signal P representing the second reference signal from the second sensor to the processor;

adapting the parameters of the cable model by the processor based on the first test signal O and the second test signal P, with the result that the transmission behavior represented by the cable model corresponds to the actual transmission behavior of the cable section that is represented by the first reference pulses and the second reference signals or by the second reference pulses and second reference signals.

20. The method as claimed in claim 19, wherein steps g) to j) or steps g) to m) are carried out once, periodically or before each execution of the group of method steps a) to e).

21. The method as claimed in claim 19, wherein the first and/or second set of curves is calculated with the cable model updated by the adapted parameters by the processor and stored in the data memory after each adaptation of the parameters of the cable model.

* * * * *